United States Patent
An et al.

(10) Patent No.: US 9,114,981 B2
(45) Date of Patent: Aug. 25, 2015

(54) SURFACE PLASMON-MEDIATED ENERGY TRANSFER OF ELECTRICALLY-PUMPED EXCITONS

(75) Inventors: Kwang Hyup An, Ann Arbor, MI (US); Max Shtein, Ann Arbor, MI (US); Kevin P. Pipe, Ann Arbor, MI (US)

(73) Assignee: The Regents of The University of Michigan, Ann Arbor, MI (US)

( * ) Notice: Subject to any disclaimer, the term of this patent is extended or adjusted under 35 U.S.C. 154(b) by 414 days.

(21) Appl. No.: 12/954,368

(22) Filed: Nov. 24, 2010

(65) Prior Publication Data

US 2011/0291079 A1    Dec. 1, 2011

Related U.S. Application Data

(60) Provisional application No. 61/264,433, filed on Nov. 25, 2009.

(51) Int. Cl.
| | | |
|---|---|---|
| H01L 51/00 | (2006.01) | |
| H01L 51/50 | (2006.01) | |
| B82Y 20/00 | (2011.01) | |
| H01L 27/32 | (2006.01) | |
| H01L 49/00 | (2006.01) | |

(52) U.S. Cl.
CPC ............... B82Y 20/00 (2013.01); H01L 27/322 (2013.01); H01L 51/00 (2013.01); H01L 51/504 (2013.01); H01L 51/5036 (2013.01); H01L 2251/5315 (2013.01)

(58) Field of Classification Search
None
See application file for complete search history.

(56) References Cited

U.S. PATENT DOCUMENTS

2004/0021415 A1\* 2/2004 Vong et al. .................. 313/509
2005/0253136 A1\* 11/2005 Ono et al. .................... 257/40

OTHER PUBLICATIONS

P. Andrew, and W. L. Barnes, "Energy transfer across a metal film mediated by surface plasmon polaritons," Science 306(5698), 1002-1005 (2004).
H. A. Atwater, "The promise of plasmonics," Sci. Am. 296(4), 56-62 (2007).
L. Cao, and M. L. Brongersma, "Active Plasmonics: Ultrafast developments," Nat. Photonics 3(1), 12-13 (2009).
K. Celebi, T. D. Heidel, and M. A. Baldo, "Simplified calculation of dipole energy transport in a multilayer stack using dyadic Green's functions," Opt. Express 15(4), 1762-1772 (2007).
Chance, R. R., Prock, A. and Silbey, R. (1978) Molecular Fluorescence and Energy Transfer Near Interfaces, in Advances in Chemical Physics, vol. 37 (eds I. Prigogine and S. A. Rice), John Wiley & Sons, Inc., Hoboken, NJ, USA. doi: 10.1002/9780470142561.ch1.

(Continued)

*Primary Examiner* — Neil N Turk
(74) *Attorney, Agent, or Firm* — Harness, Dickey & Pierce, P.L.C.

(57) ABSTRACT

An electrically pumped light emitting device emits a light when powered by a power source. The light emitting device includes a first electrode, a second electrode including an outer surface, and at least one active organic semiconductor disposed between the first and second electrodes. The device also includes a dye adjacent the outer surface of the second electrode such that the second electrode is disposed between the dye and the active organic semiconductor. A voltage applied by the power source across the first and second electrodes causes energy to couple from decaying dipoles into surface plasmon polariton modes, which then evanescently couple to the dye to cause the light to be emitted.

12 Claims, 2 Drawing Sheets

(56) References Cited

OTHER PUBLICATIONS

N. Fang, Z. W. Liu, T. J. Yen, and X. Zhang, "Regenerating evanescent waves from a silver superlens," Opt. Express 11(7), 682-687 (2003).

J. Feng, T. Okamoto, R. Naraoka, and S. Kawata, "Enhancement of surface plasmon-mediated radiative energy transfer through a corrugated metal cathode in organic light-emitting devices," Appl. Phys. Lett. 93(5), 051106 (2008).

D. K. Gifford, and D. G. Hall, "Emission through one of two metal electrodes of an organic light-emitting diode via surface-plasmon cross coupling," Appl. Phys. Lett. 81(23), 4315-4317 (2002).

T. D. Heidel, J. K. Mapel, K. Celebi, M. Singh, and M. A. Baldo, "Analysis of surface plasmon polariton mediated energy transfer in organic photovoltaic devices—art. No. 66560I," Org. Photovoltaics VIII 6656,I6560 (2007).

J. Homola, S. S. Yee, and G. Gauglitz, "Surface plasmon resonance sensors: review," Sen. Actuators B 54(1-2), 3-15 (1999).

Q. Huang, K. Walzer, M. Pfeiffer, V. Lyssenko, G. He, and K. Leo, "Highly efficient top emitting organic light-emitting diodes with organic outcoupling enhancement layers," Appl. Phys. Lett. 88(11), 113515 (2006).

D. M. Koller, A. Hohenau, H. Ditlbacher, N. Geller, F. Reil, F. R. Aussenegg, A. Leitner, E. J. W. List, and J. R. Krenn, "Organic plasmon-emitting diode," Nat. Photonics 2(11), 684-687 (2008).

Z. W. Liu, N. Fang, T. J. Yen, and X. Zhang, "Rapid growth of evanescent wave by a silver superlens," Appl. Phys. Lett. 83(25), 5184-5186 (2003).

J. K. Mapel, M. Singh, M. A. Baldo, and K. Celebi, "Plasmonic excitation of organic double heterostructure solar cells," Appl. Phys. Lett. 90(12), 121102 (2007).

K. Okamoto, I. Niki, A. Shvartser, Y. Narukawa, T. Mukai, and A. Scherer, "Surface-plasmon-enhanced light emitters based on InGaN quantum wells," Nat. Mater. 3(9), 601-605 (2004).

E. Ozbay, "Plasmonics: merging photonics and electronics at nanoscale dimensions," Science 311(5758), 189-193 (2006).

J. B. Pendry, "Negative refraction makes a perfect lens," Phys. Rev. Lett. 85(18), 3966-3969 (2000).

H. Riel, S. Karg, T. Beierlein, W. Rieß, and K. Neyts, "Tuning the emission characteristics of top-emitting organic light-emitting devices by means of a dielectric capping layer: An experimental and theoretical study," J. Appl. Phys. 94(8), 5290-5296 (2003).

B. Rothenhäusler, and W. Knoll, "Surface-plasmon microscopy," Nature 332(6165), 615-617 (1988).

C. W. Tang, and S. A. Vanslyke, "Organic electroluminescent diodes," Appl. Phys. Lett. 51(12), 913-915 (1987).

T. Wakamatsu, K. Saito, Y. Sakakibara, and H. Yokoyama, "Enhanced photocurrent in organic photoelectric cells based on surface-plasmon excitations," Jpn. J. Appl. Phys. 34(Pt. 2, No. 11A), L1467-L1469 (1995).

S. Wedge, I. R. Hooper, I. Sage, and W. L. Barnes, "Light emission through a corrugated metal film: The role of cross-coupled surface plasmon polaritons," Phys. Rev. B 69(24), 245418 (2004).

\* cited by examiner

SURFACE PLASMON-MEDIATED ENERGY TRANSFER OF ELECTRICALLY-PUMPED EXCITONS

CROSS-REFERENCE TO RELATED APPLICATIONS

This application claims the benefit of U.S. Provisional Application No. 61/264,433, filed on Nov. 25, 2009. The entire disclosure of the above application is incorporated herein by reference.

GOVERNMENT RIGHTS

This invention was made with government support under Grant No. DE-SC0000957 awarded by the Department of Energy and Grant No. FA9550-06-1-0399 awarded by the Air Force Office of Scientific Research. The government has certain rights in the invention.

FIELD

The present disclosure relates to a light emitting device and, more particularly, to a light emitting device that relies on surface plasmon-mediated energy transfer of electrically pumped excitons to emit light.

BACKGROUND

The statements in this section merely provide background information related to the present disclosure and may not constitute prior art.

Light emitting devices have been proposed that include a thin-metal film sandwiched between two organic layers. One of the organic layers can have a green emitting dye therein, and the other can have a red emitting dye therein. A laser (i.e., an optically pumped oscillating electric filed) can be used to excite the molecules of the green dye, creating excitons, which excite surface plasmon polaritons in the metal film, which thereby excite the red dye, and light is emitted. Thus, the surface plasmons can mediate energy transfer from optically pumped dipoles across the metal film to the red dye.

This type of device has been proposed for various uses, including lighting, solar cells, etc. However, these types of devices do have various disadvantages. For instance, these devices are optically pumped by the laser (i.e., coherent excitation), which can limit their usefulness.

SUMMARY

An electrically pumped light emitting device that emits a light when powered by a power source is disclosed. The light emitting device includes a first electrode, a second electrode including an outer surface, and at least one active organic semiconductor disposed between the first and second electrodes. The device also includes a dye adjacent the outer surface of the second electrode such that the second electrode is disposed between the dye and the active organic semiconductor. A voltage applied by the power source across the first and second electrodes causes energy to couple from decaying dipoles into surface plasmon polariton modes, which then evanescently couple to the dye to cause the light to be emitted.

A method of manufacturing an electrically pumped light emitting device that emits a light when powered by a power source is also disclosed. The method includes providing a first electrode on a substrate and providing at least one active organic semiconductor on the first electrode. The method also includes providing a second electrode on the active organic semiconductor such that the active organic semiconductor is disposed between the first and second electrodes. In addition, the method includes providing a dye adjacent an outer surface of the second electrode such that the second electrode is disposed between the dye and the at least one active organic semiconductor and such that a voltage applied by the power source across the first and second electrodes causes energy to couple from decaying dipoles into surface plasmon polariton modes, which then evanescently couple to the dye to cause the light to be emitted.

Still further, a sensor is disclosed that includes a test device that includes a first electrode, a second electrode, and at least one active organic semiconductor disposed between the first and second electrodes. The test device is operable to receive a first substance adjacent the second electrode such that the second electrode is disposed between the first substance and the at least one active organic semiconductor. The sensor also includes a power source that applies a voltage across the first and second electrodes. Moreover, the sensor includes a delivery device that delivers a second substance to the test device. The second substance has possible affinity with the first substance. At least one of the first and second substances has a dye. The voltage applied by the power source across the first and second electrodes causes energy to couple from decaying dipoles into surface plasmon polariton modes, which then evanescently couple to the dye to cause the light to be emitted and to indicate the affinity of the first and second substances.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

Figure 1:
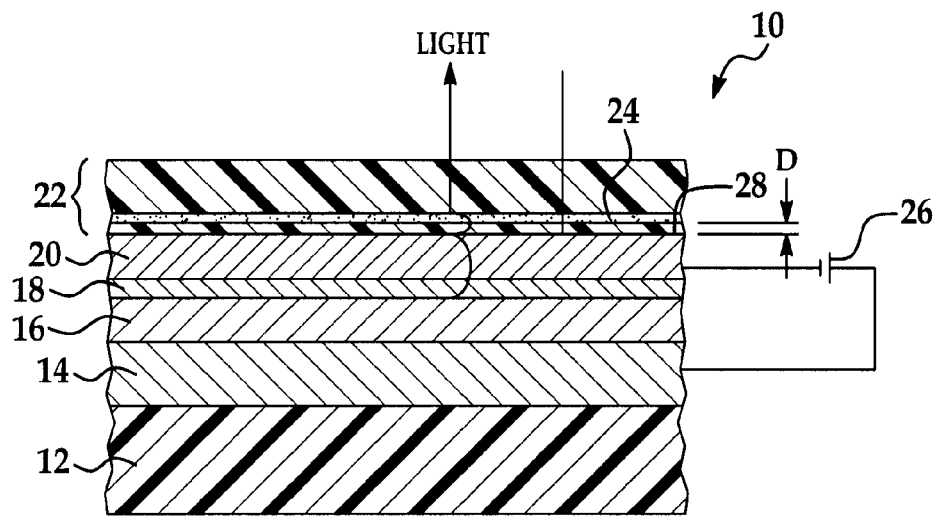
FIG. 1 is a cross sectional view of a light emitting device according to various teachings of the present disclosure.

The following description is merely exemplary in nature and is not intended to limit the present disclosure, application, or uses. It should be understood that throughout the drawings, corresponding reference numerals indicate like or corresponding parts and features.

Referring initially to FIG. 1, a light emitting device 10 is illustrated. Generally, the light emitting device 10 can include a substrate 12, a first electrode 14, at least one or more active organic semiconductors 16, 18, a second electrode 20, and a dielectric capping layer 22. The first electrode 14 can be disposed directly on the substrate 12, and the semiconductors 16, 18 can be disposed between the first and second electrodes 14, 20. Also, the capping layer 22 can be disposed adjacent the outer surface 28 of the second electrode 20 such that the second electrode 20 is disposed between the capping layer 22 and the organic semiconductors 16, 18. In some embodiments, the capping layer 22 can be disposed directly on the outer surface 28 of the second electrode 20.

As shown in FIG. 1, the light emitting device 10 can be a laminated structure with a plurality of layers lying over each other. Specifically, the first electrode 14 can be layered directly on the substrate 12, the organic semiconductor 16 can be layered directly on the first electrode 14, the organic semiconductor 18 can be layered directly on the organic semiconductor 16, second electrode 20 can be layered directly on the organic semiconductor 18, and the capping layer 22 can be layered directly on the second electrode 20.

The light emitting device 10 can also include a fluorescent dye 24 that is disposed adjacent the outer surface 28 of the second electrode 20. The dye 24 can be of any suitable type, such as 4-dicyanomethylene-2-methyl-6-[2-(2,3,6,7-tetrahydro-1H,5H-benzo[ij]quinolizin-8-yl)vinyl]-4H-pyran (i.e., DCM2) fluorescent dye. In other embodiments, the dye 24 can be one or more quantum dots. In some embodiments, the capping layer 22 can be doped with the dye 24 (i.e., the dye 24 can be doped within the capping layer 22) such that the dye 24 is disposed in a localized region (e.g., as a layer) within the capping layer 22. Furthermore, the dye 24 can be disposed closely adjacent the outer surface 28 of the second electrode 20. For instance, the dye 24 can be spaced away from the outer surface 28 by a distance D of approximately 10 nanometers. It will be appreciated that the distance D or separation between the dye 24 and the outer surface 28 can effect functioning (e.g., efficiency) of the device 10. Accordingly, the distance D can be adapted according to the desired operational characteristics of the device 10.

Moreover, the first and second electrodes 14, 22 can be operatively and electrically connected to an electrical power source 26 of any suitable type. As will be discussed, the power source 26 can apply a voltage across the first and second electrodes 14, 22 to cause energy to couple from decaying dipoles into surface plasmon polariton modes, which then evanescently couple to the dye 24 to create the light (represented by an arrow in FIG. 1).

The substrate 12 can be of any suitable type. For instance, the substrate 12 can be a sheet of glass or a film of plastic. The substrate 12 can support lamination of the first electrode 14, the semiconductors 16, 18, the second electrode 20, and the capping layer 22. However, it will be appreciated that the device 10 can be formed in any other suitable manner other than lamination without departing from the scope of the present disclosure.

The first electrode 14 can also be of any suitable type. For instance, the first electrode 14 can be made from or include indium tin oxide. As such, the first electrode 14 can be substantially transparent. In other embodiments, the first electrode 14 can be substantially opaque. The first electrode 14 can also be made from or include aluminum, nickel, gold, or any other suitable material. The first electrode 14 can have a thickness of approximately 150 nanometers or any other suitable thickness.

Moreover, the semiconductors 16, 18 can include both a hole transport semiconductor layer 16 and an electron transport semiconductor layer 18. The hole transport semiconductor layer 16 can be made from or include 4,4-bis[N-(1-naphthyl)-N-phenyl-amino]biphenyl (α-NPD) or any other suitable material. Also, the electron transport semiconductor layer 18 can be made from or include tris(8-hydroxyquinolino)-aluminum (Alq3) or any other suitable material. In addition, the semiconductor layers 16, 18 can have any suitable thicknesses. For instance, the hole transport semiconductor layer 16 can have a thickness of approximately 50 nanometers, and the electron transport semiconductor layer 18 can have a thickness of approximately 15 nanometers. The hole transport semiconductor layer 16 can be disposed directly adjacent the first electrode 14, and the electron transport semiconductor layer 18 can be disposed directly adjacent the second electrode 20. It will be appreciated that the device 10 can include additional layers between the electrodes 14, 20, such as blocking layers, etc. Furthermore, the semiconductors 16, 18 can include one or more quantum dots in some embodiments.

The second electrode 20 can be of any suitable type and can include any suitable material. For instance, the second electrode 20 can be made from or include silver, gold, platinum, and/or aluminum. The second electrode 20 can have a thickness of approximately 50 nanometers or any other appropriate thickness.

One of ordinary skill in the art will appreciate that the first electrode 14, the semiconductor layers 16, 18, and the second electrode 20 can be configured and constructed in a manner similar to organic light emitting diodes (OLEDs) of the prior art. However, the electron transport semiconductor layer 18 can be thinner than other conventional OLEDs in order to maximize dipole-dipole energy transfer from excitons to the second electrode 20 as will be discussed. Also, in still other embodiments, the first and/or second electrodes 14, 20 can be thicker than electrodes of conventional OLEDs and yet light can still be emitted. As will be discussed, this increased thickness can allow electricity to be distributed without substantial losses over a substantially large area. As such, the device 10 can operate more efficiently. This can also make the device 10 more robust, can facilitate handling during manufacturing, and can reduce manufacturing costs.

The capping layer 22 can be of any suitable type. In some embodiments, the capping layer 22 can be made from or include a dielectric material, such as α-NPD. Also, the capping layer 22 can have a thickness of between approximately 100 and 200 nanometers (e.g., 150 nanometers) or any other suitable thickness. The dye 24 can be doped into the capping layer 22 with 5% mass ratio.

Furthermore, the first electrode 14 can be connected to the power source 26 to function as an anode, and the second electrode 20 can be connected to the power source 26 to function as a cathode. As such, when the power source 26 applies a voltage across the first and second electrodes 14, 20 a current can flow through the semiconductor layers 16, 18 from the second electrode 20 to the first electrode 14. Thus, the second electrode 20 gives electrons to the electron transport semiconductor layer 18, and the first electrode 14 withdraws electrons from the hole transport semiconductor layer 16. In other words, the first electrode 14 gives electron holes to the hole transport semiconductor layer 16.

Soon, the electron transport semiconductor layer 18 becomes negatively charged, while the hole transport semiconductor layer 16 becomes rich in positively charged holes. Electrostatic forces bring the electrons and the holes towards each other and they recombine. The recombination causes a drop in the energy levels of the electrons, accompanied by an emission of radiation, creating excitons. It will be appreciated that these excitons are created due to energy pumping from the power source 26.

Because the different layers are thin, the electron recombination zone (i.e., where light is emitted) can be within tens of nanometers of the second electrode 20, resulting in strong waveguiding, as well as coupling of exciton radiative energy to non-radiative surface plasmons (e.g., on the outer surface 28 of the second electrode 20).

As such, energy can couple from these decaying dipoles into surface plasmon polariton (SPP) modes, which then can evanescently couple to the emissive dye 24 within the capping layer 22. This can occur through a resonant near-field process, leading to strong light emission from the dye 24, as represented by an arrow in FIG. 1.

In some embodiments, the light emitted exhibits a significant peak in the red portion of the spectrum due to the type of dye 24 used. Thus, the light can appear red or reddish-orange. Also, the red peak can be stronger when the dye 24 is closer to the outer surface 28. Thus, the peak is due to a resonant plasmon-assisted transfer of energy from decaying excitons in the device 10 across the second electrode 20 to the dye 24. In some embodiments, the device 10 shows a seven-fold enhancement of light emission from an external dye.

It will be appreciated, however, that the light emitted can be of any color without departing from the scope of the present disclosure. This is because the process described above can occur across any wavelength if suitable materials are used. Also, a plurality of dyes 24 of different colors can be included such that the combination causes the emitted light to have a desired color (e.g., substantially white light).

Accordingly, the device 10 can have various uses. For instance, the device 10 can improve top-emission in OLEDs in display and lighting applications. More specifically, the device 10 can be used to enhance light out-coupling efficiency in OLEDs that have thick electrodes that would otherwise be substantially opaque. Also, the device 10 can be used in OLED-based displays or organically-based solid state lighting. Furthermore, should other combinations of dyes 24 be used upstream and downstream of the second electrode 20, substantially white light emission can be achieved.

In addition, the device 10 can be used as an integrated electrically-pumped evanescent wave generator, with applications in substantially high resolution optical microscopy and other chemical sensors. In some embodiments, the device 10 can be incorporated into a lab-on-a-chip system.

Figure 2A:
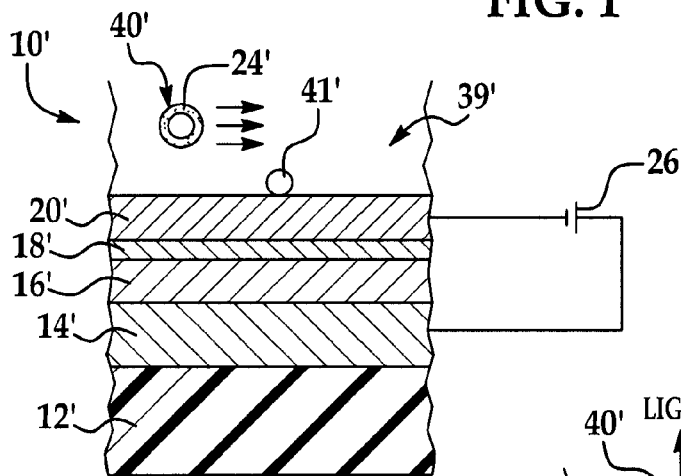
FIGS. 2A and 2B are schematic views of a sensor that incorporates features of the light emitting device of FIG. 1.
Figure 2B:
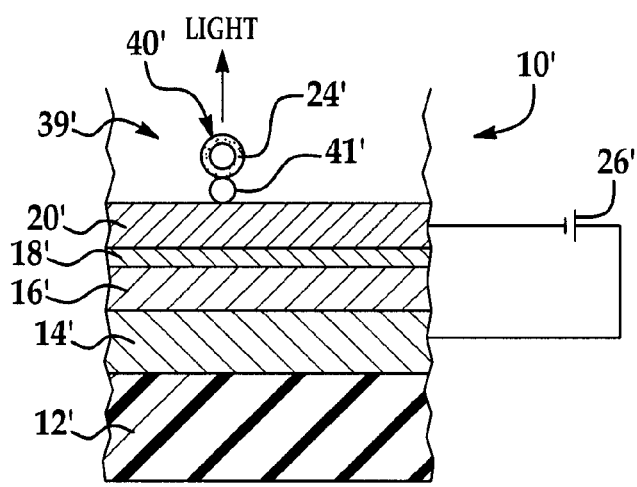

For instance, as shown in FIGS. 2A and 2B, the device 10' can be adapted for use as a sensor, such as a chemical sensor, biomedical diagnostic tool, etc. Specifically, the device 10' can include the substrate 12', such as a chip, with the first electrode 14', the active organic semiconductors 16', 18', and the second electrode 20' layered thereon, similar to the embodiments discussed above. The device 10' can also be operable to receive a first substance 41'. The first substance 41' can be of any type, such as molecules of a chemical (e.g., a protein) that are intended for testing. The first substance 41' can be deposited on the second electrode 20' in any suitable known manner.

Also, the device 10' can be in communication with a delivery device 39', such as a channel through which a fluid media flows. A second substance 40' can be delivered to the device 10' via the delivery device 39'. The second substance 40' can be of any type, such as molecules of a chemical (e.g., a protein) that are also intended for testing. The second substance 40' may or may not have affinity for the first substance 41' (i.e., the second substance 40' has possible affinity for the first substance 41'), and the purpose of the test is to determine whether the substances 40', 41' have affinity as will be discussed.

Also, at least one of the first and second substances 41', 40' can include the dye 24'. For instance, in the embodiment shown, only the second substance 40' can include the dye 24'; however, in other embodiments, only the first substance 41' may include the dye 24'. The dye 24' can be included on the substance(s) 40', 41' in any suitable known manner.

As shown in FIG. 2B, if the substances 40', 41' have affinity, then the dye 24' comes in close enough proximity to the device 10' to cause light to be emitted as discussed in detail above in relation to the embodiments of FIG. 1. However, if the substances 40', 41' do not have affinity, the second substance 40' will move past the first substance 41', and the light will not be emitted.

Thus, the user can determine whether the substances 40', 41' have affinity based on whether light is observed. A light detector (not shown) can also be used to detect whether any light is emitted. It will be appreciated that the device 10' can be manufactured efficiently (e.g., as a lab-on-a-chip), and the device 10' can provide very accurate results. In these applications, the device 10' relies on energy pumped from the power source 26' in order to create the light instead of optical pumping (i.e., coherent excitation) known in the prior art. As such, the device 10' can have a wider range of uses than optically pumped devices of the prior art.

Figure 3A:
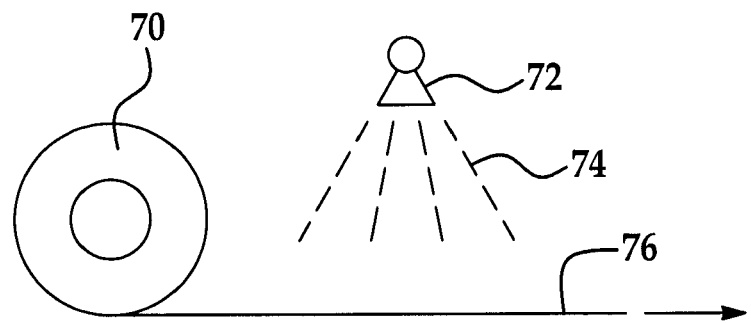
FIGS. 3A and 3B are schematic views of methods of manufacturing the light emitting device of FIG. 1.
Figure 3B:
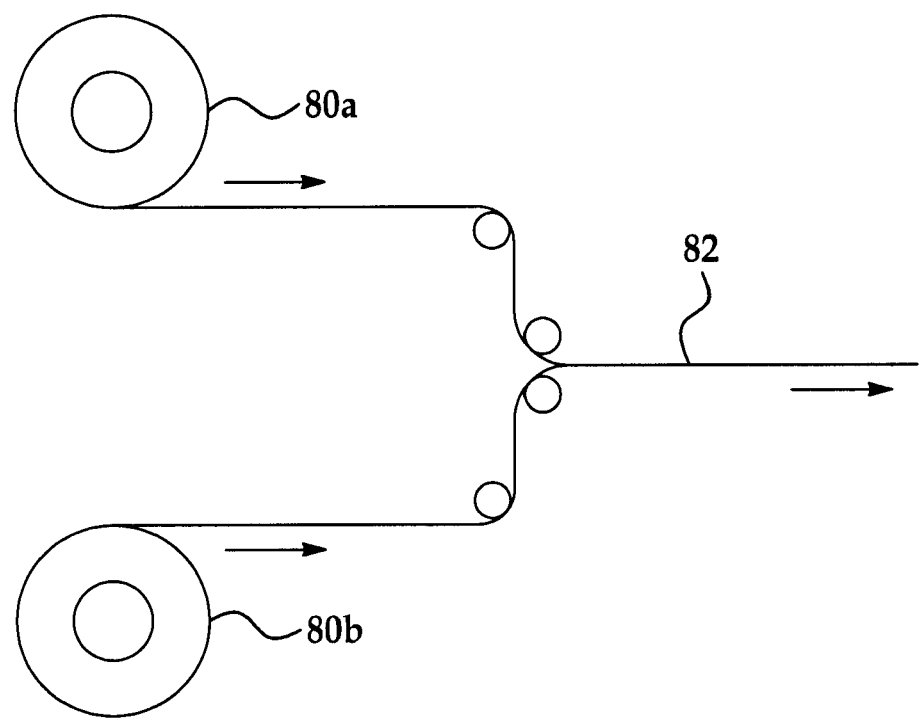

The device 10 (and the device 10' of FIGS. 2A and 2B) can be manufactured in various ways as shown in FIGS. 3A and 3B. For instance, as shown in FIG. 3A, a sprayer 72 can be employed to spray materials 74 of the first electrode 14, the organic semiconductor layers 16, 18, the second electrode 20, and/or the capping layer 22 onto a sheet 76. The sheet 76 can be collected into a roll or other collection of bulk material 70. Then, the sheet 76 can be layered onto another sheet (not shown) to thereby laminate the different layers of the device 10. Laminating the layers together can occur in any suitable known fashion.

Also, in some embodiments, the sheet 76 can start as the substrate layer 12, then the material 74 of the first electrode 14 can be sprayed thereon, then the organic layer 16 can be sprayed thereon, then the organic layer 18, and so on until the device 10 is formed. In still other embodiments, the sheet 76 can start as the substrate layer 12, the organic layers 16, 18 can be sprayed thereon, a separate sheet 76 can be formed with the second electrode 20 and capping layer 22 thereon, and the two sheets 76 can be laminated together to form the device 10. It will be appreciated that the sprayer 72 can be used for application of any of the layers of the device 10.

Also, in some embodiments represented in FIG. 3B, multiple rolls 80a, 80b of bulk material can be provided. Each of the rolls 80a, 80b can include one or more of the different layers of the device 10. For example, the roll 80a can include the substrate 12, the first electrode 14, the organic layers 16, 18, and the second electrode 20 laminated together, and the roll 80b can include the capping layer 22. Then, the rolls 80a, 80b can be fed toward each other and laminated together to form a sheet 82, which can be further formed into the device 10 discussed above.

Also, in other embodiments, the first electrode 14 can be laminated on the substrate 12, and then the organic semiconductor layers 16, 18 can be laminated on the first electrode 14. Separately, the second electrode 20 can be laminated on the capping layer 22. Both of these steps can occur in a reel-to-reel manufacturing method as discussed above. Then, the second electrode 20 can be coupled to the organic semiconductor layer 18 to resemble the device 10 shown in FIG. 1.

Also, in some embodiments, the materials can be applied by physical vapor deposition (PVD), chemical vapor deposition (CVD), electrochemical deposition (ECD), molecular beam epitaxy (MBE), atomic layer deposition (ALD), etc. Furthermore, portions of the different layers can be applied and then removed in a known etching technique to form a desired pattern within the particular layer.

Both the spraying manufacturing technique of FIG. 3A, the reel-to-reel manufacturing technique of FIG. 3B, and the other techniques for manufacturing the device 10 can be very efficient and relatively inexpensive. Also, the device 10 can have a wide variety of uses, such as lighting, use in electronic displays, chemical sensors, etc. because the device 10 is electrically pumped.

While the disclosure has been described in the specification and illustrated in the drawings with reference to various embodiments, it will be understood by those skilled in the art that various changes may be made and equivalents may be substituted for elements thereof without departing from the scope of the disclosure as defined in the claims. Furthermore, the mixing and matching of features, steps, elements and/or functions between various embodiments is expressly contemplated herein so that one of ordinary skill in the art would appreciate from this disclosure that features, steps, elements and/or functions of one embodiment may be incorporated into another embodiment as appropriate, unless described otherwise above. Moreover, many modifications may be made to adapt a particular situation or material to the teachings of the disclosure without departing from the essential scope thereof. Therefore, it is intended that the disclosure not be limited to the particular embodiment illustrated by the drawings and described in the specification as the best mode presently contemplated for carrying out this disclosure, but that the disclosure will include any embodiments falling within the foregoing description and the appended claims.

What is claimed is:

1. An electrically pumped, multi-layer device that admits electrons and holes when powered by a power source and emits light, the device comprising:
    a first electrode;
    a second electrode including an outer surface, said second electrode comprising a metal chosen from the group consisting of silver, gold, platinum, and aluminum;
    two active organic semiconductors disposed between the first and second electrodes;
    a dye adjacent the outer surface of the metallic second electrode such that the second electrode is disposed between the dye and the two active organic semiconductors; and
    a dielectric capping layer adjacent the outer surface of the second electrode and the dye being doped within the dielectric capping layer at a distance from the outer surface of the second electrode.

2. The device of claim 1, wherein the distance is approximately 10 nanometers.

3. The device of claim 1, wherein the second electrode is a cathode.

4. The device of claim 1, wherein the first electrode includes at least one of indium tin oxide, aluminum, nickel, and gold.

5. The device of claim 1, wherein the first electrode is substantially transparent.

6. The device of claim 1, wherein the active organic semiconductors includes a hole transport layer and an electron transport layer.

7. The device of claim 6, wherein the hole transport layer includes 4,4-bis[N-(1-naphthyl)-N-phenyl-amino]biphenyl (α-NPD).

8. The device of claim 6, wherein the electron transport layer includes tris(8-hydroxyquinolino)-aluminum (Alq3).

9. The device of claim 6, wherein the hole transport layer is layered directly on the first electrode, the electron transport layer is layered directly on the hole transport layer, and the second electrode is layered directly on the electron transport layer.

10. The device of claim 1, further comprising a substrate, wherein the first electrode is layered directly on the substrate.

11. The device of claim 10, wherein the substrate includes at least one of glass and plastic.

12. The device of claim 1, further comprising:
    a power source electrically coupled to the first and second electrodes to apply a voltage thereacross, a voltage applied by the power source on the first and second electrodes causes holes and electrons to be injected from the first and second electrodes respectively, the holes and electrons recombining between the first and second electrodes wherein initial recombination excitation on the two semiconductors occurring within tens of nanometers from the metallic second electrode resulting in coupling to surface plasmon polariton modes supported by the metallic second electrode, which then evanescently couple to the dye adjacent the outer surface of the metallic second electrode to provide the emitted light.

* * * * *